(12) United States Patent
Shih et al.

(10) Patent No.: US 11,201,100 B2
(45) Date of Patent: Dec. 14, 2021

(54) SOLID-STATE STORAGE DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yu-Ting Shih, Hsinchu (TW); Chen-Wei Hung, Hsinchu (TW); Jia-Liang Chen, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/985,727

(22) Filed: May 22, 2018

(65) Prior Publication Data

US 2019/0229036 A1 Jul. 25, 2019

(30) Foreign Application Priority Data

Jan. 19, 2018 (CN) .......................... 201810053474.0

(51) Int. Cl.
```
H01L 23/00    (2006.01)
H01L 23/40    (2006.01)
H01L 23/04    (2006.01)
H01L 25/065   (2006.01)
```
(52) U.S. Cl.
CPC .......... *H01L 23/4006* (2013.01); *H01L 23/04* (2013.01); *H01L 23/041* (2013.01); *H01L 24/16* (2013.01); *H01L 25/0655* (2013.01); *H01L 2023/405* (2013.01); *H01L 2023/4031* (2013.01); *H01L 2023/4062* (2013.01); *H01L 2023/4087* (2013.01); *H01L 2224/16225* (2013.01); *H01L 2924/1438* (2013.01); (Continued)

(58) Field of Classification Search
CPC ..... H01L 24/16; H01L 23/04; H01L 25/0655; H05K 1/02
See application file for complete search history.

(56) References Cited

U.S. PATENT DOCUMENTS

2008/0006915 A1* 1/2008 Nakamura .............. H01L 23/42
    257/675
2009/0250806 A1* 10/2009 Wang ...................... H01L 23/38
    257/712

(Continued)

FOREIGN PATENT DOCUMENTS

CN 101515550 A 8/2009
TW 201044148 A 12/2010

*Primary Examiner* — Kenneth Parker
*Assistant Examiner* — Long H Le
(74) *Attorney, Agent, or Firm* — CKC & Partners Co., LLC

(57) ABSTRACT

A solid-state storage device includes a housing, a wiring board and a semiconductor package unit. The housing is formed with a heat-dissipating recess thereon. The wiring board is fixed in the housing. One side of the semiconductor package unit is mounted on the wiring board, and the other side of the semiconductor package unit is embedded in the heat-dissipating recess. A top surface and lateral surfaces surrounding the top surface of the semiconductor package unit are all thermally connected to the housing in the heat-dissipating recess.

5 Claims, 10 Drawing Sheets

(52) U.S. Cl.
CPC ............... *H01L 2924/14361* (2013.01); *H01L 2924/20104* (2013.01)

(56) References Cited

U.S. PATENT DOCUMENTS

| | | | |
|---|---|---|---|
| 2012/0241942 A1* | 9/2012 | Ihara | H01L 23/3675 257/712 |
| 2013/0314877 A1* | 11/2013 | Watanabe | H01L 23/34 361/719 |
| 2014/0239488 A1* | 8/2014 | Kobayashi | H01L 23/36 257/718 |
| 2014/0306335 A1* | 10/2014 | Mataya | H01L 23/373 257/713 |
| 2015/0348865 A1* | 12/2015 | Vincent | H01L 24/03 257/712 |
| 2017/0025393 A1* | 1/2017 | Lin | H01L 25/0657 |

\* cited by examiner

SOLID-STATE STORAGE DEVICE

RELATED APPLICATIONS

This application claims priority to China Application Serial Number 201810053474.0, filed Jan. 19, 2018, which is herein incorporated by reference.

BACKGROUND

Field of Disclosure

The present disclosure relates to a solid-state storage device. More particularly, the present disclosure relates to a solid-state storage device having a heat-dissipating recess.

Description of Related Art

In general, solid-state drives (SSDs) have the advantages of fast read and write speeds, large storage capacity, small physical size, and good shock resistance etc., so that the solid-state hard disks are increasingly widely used.

However, because the solid-state hard disk continues to develop toward miniaturization to continuously shrink the internal space of the solid-state hard disk, a heat source (e.g., processing unit) in the solid-state hard disk must be closely arranged, so that the accompanying heat dissipation problem may also become increasingly serious, which will lead the process unit to be burned because of high temperature in a lot of works.

Therefore, how to develop a solution to effectively overcome the aforementioned inconveniences and disadvantages is an urgent and important topic for the industry.

SUMMARY

According to one embodiment, a solid-state storage device includes a housing, a wiring board and a semiconductor package unit. The housing includes a cover plate, a bottom plate and a heat-dissipating recess formed on the cover plate, and the cover plate covers the bottom plate to form a receiving space between the cover plate and the bottom plate. The wiring board is fixed in the receiving space. The semiconductor package unit is embedded in the heat-dissipating recess. The semiconductor package unit is provided with a top surface, a bottom surface and lateral surfaces. The bottom surface is opposite to the top surface and is adjacent to the lateral surfaces. The bottom surface of the semiconductor package unit is fixed to the wiring board, and the top surface and the lateral surfaces of the semiconductor package unit are thermally connected to the housing in the heat-dissipating recess.

Thus, in the above embodiment, not only the heat dissipation efficiency of the solid-state storage device can be improved so as to further improve the system stability and product life of the solid-state storage device, but also the overall thickness of the solid-state storage device can be effectively reduced.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
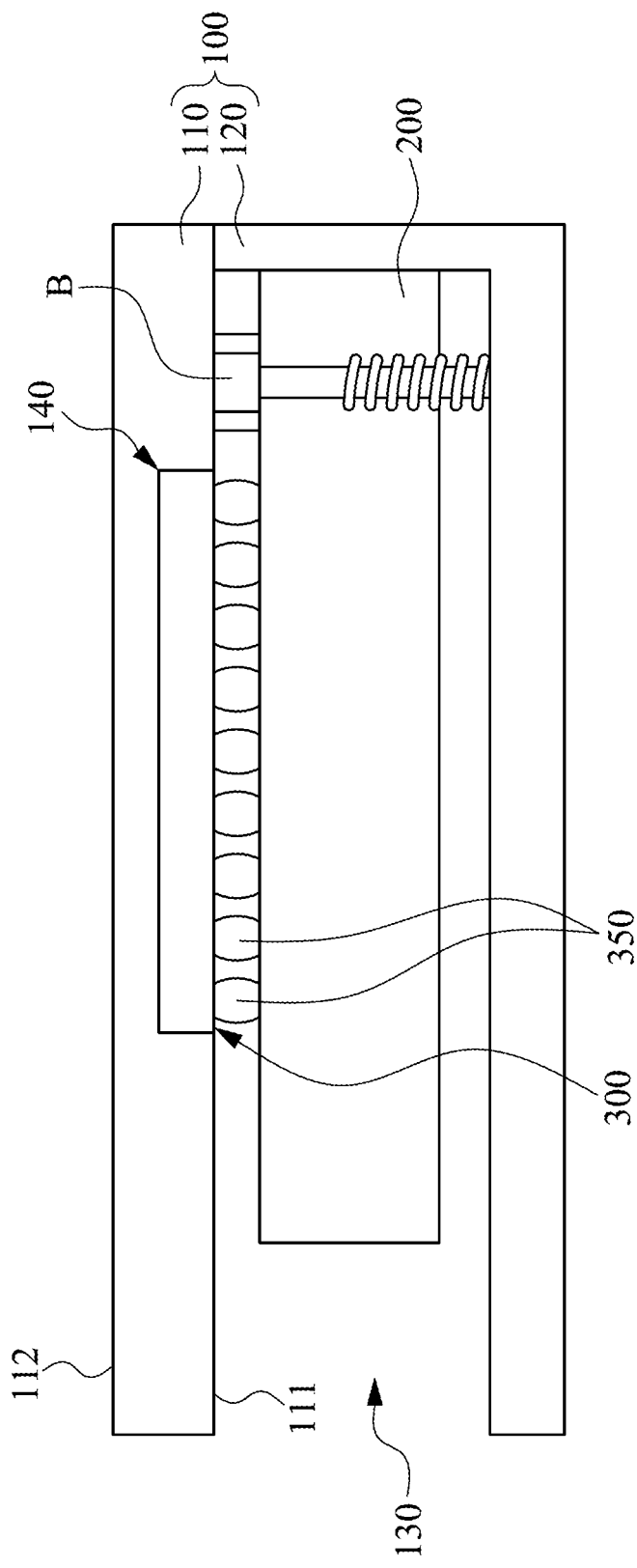
FIG. 1 is a schematic view of a solid-state storage device according to a first embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

First Embodiment

Figure 2:
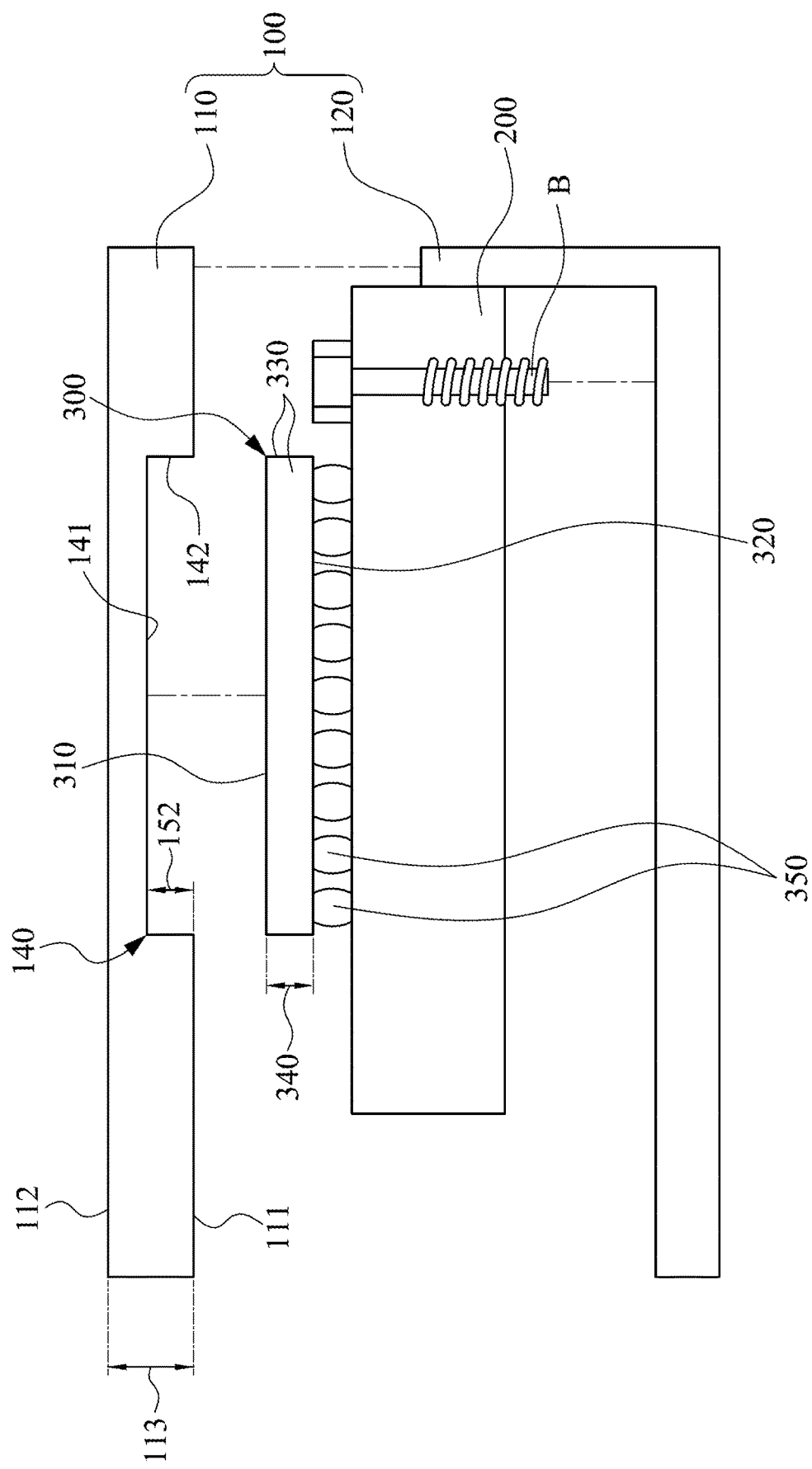
FIG. 2 is an exploded view of the solid-state storage device of FIG. 1.

Reference is now made to FIG. 1 and FIG. 2 in which FIG. 1 is a schematic view of a solid-state storage device 10 according to a first embodiment of the disclosure, and FIG. 2 is an exploded view of the solid-state storage device 10 of FIG. 1. As shown in FIG. 1 and FIG. 2, the solid-state storage device 10 includes a housing 100, a wiring board 200 and at least one semiconductor package unit 300. The housing 100 includes a cover plate 110, a bottom plate 120 and at least one heat-dissipating recess 140. The cover plate 110 covers the bottom plate 120 to form a receiving space 130 between the cover plate 110 and the bottom plate 120. The wiring board 200 is fixed in the receiving space 130, for example, the wiring board 200 is fixed on the bottom plate 120 by bolts B, however, the disclosure is not limited thereto. The heat-dissipating recess 140 is formed on the cover plate 110. The semiconductor package unit 300 is disposed in the housing 100 in which the semiconductor package unit 300 is fixed on one surface of the wiring board 200 on one hand, and is embedded in the heat-dissipating recess 140.

Specifically, the semiconductor package unit 300 is provided with a top surface 310, a bottom surface 320 and lateral surfaces 330. The bottom surface 320 is opposite to the top surface 310, and the bottom surface 320 is soldered on one surface of the wiring board 200 through soldering units 350 (e.g., e.g., ball grid array, BGA). The top surface 310 and the bottom surface 320 are respectively adjacent to the lateral surfaces 330. The lateral surfaces 330 are disposed between the top surface 310 and the bottom surface 320, and the lateral surfaces 330 mutually surround the top surface 310 and the bottom surface 320. When the cover plate 110 covers the wiring board 200, the top surface 310 and the lateral surfaces 330 of the semiconductor package unit 300 are thermally connected to the housing 100 in the heat-dissipating recess 140.

Thus, since the top surface 310 and all of the lateral surfaces 330 of the semiconductor package unit 300 are thermally connected to the housing 100 in the heat-dissipating recess 140, not only more heat dissipation paths of the semiconductor package unit 300 to the housing 100 can be provided so as to improve the heat dissipation efficiency of the solid-state storage device 10, and to further improve the system stability and product life of the solid-state storage device 10, but also the overall thickness of the solid-state storage device 10 can be effectively reduced.

Specifically, in the embodiment, the cover plate 110 is formed in a plate shape, and the cover plate 110 is provided with an inner surface 111 and an outer surface 112 which is opposite to the inner surface 111. The heat-dissipating recess 140 is formed on the inner surface 111 of the cover plate 110, and is sunken in a direction from the inner surface 111 to the outer surface 112. In other words, the heat-dissipating recess 140 is a blind hole. Specifically, the heat-dissipating recess 140 includes a bottom wall 141 and a plurality of inner sidewalls 142. The inner sidewalls 142 mutually surround the bottom wall 141, and the inner sidewalls 142 are respectively adjacent to the bottom wall 141. When the wiring board 200 covers the inner surface 111 of the cover plate 110, the semiconductor package unit 300 extends into the heat-dissipating recess 140 so that the top surface 310 of the semiconductor package unit 300 is in direct contact with the bottom wall 141 of the heat-dissipating recess 140, and the lateral surfaces 330 of the semiconductor package unit 300 are respectively in direct contact with the inner sidewalls 142 of the heat-dissipating recess 140. Preferably, the all areas of the top surface 310 of the semiconductor package unit 300 fully fit and are in direct contact with the bottom wall 141 of the heat-dissipating recess 140, and all areas of each of the lateral surfaces 330 of the semiconductor package unit 300 fully fit and are in direct contact with one of the inner sidewalls 142 of the heat-dissipating recess 140. In addition, the material of the cover plate 110 is aluminum, copper metal or other highly thermally conductive material. However, the disclosure is not limited thereto.

Figure 3:
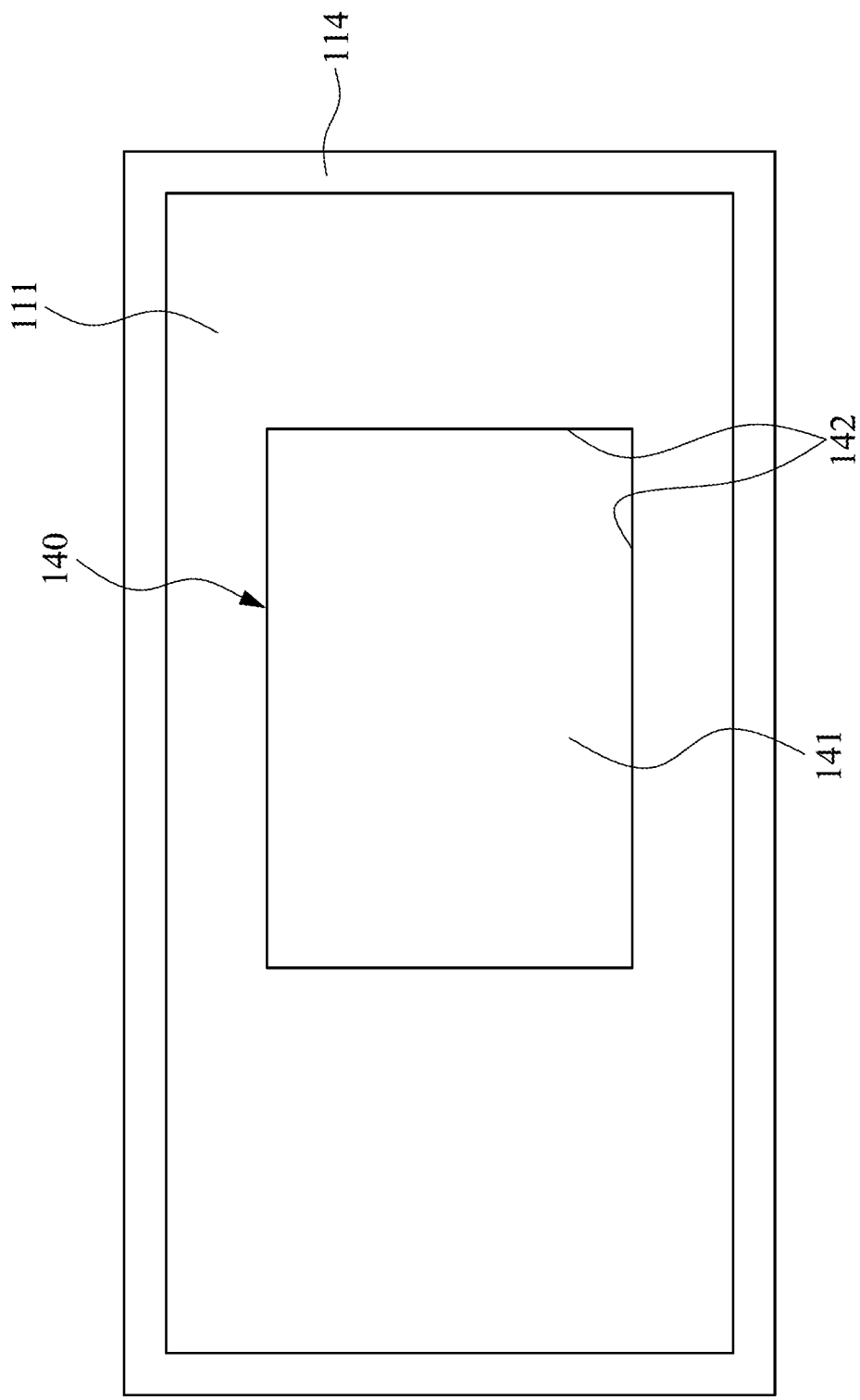
FIG. 3 is a top view of a cover plate of FIG. 2.

FIG. 3 is a top view of a cover plate of FIG. 2. A shown in FIG. 2 and FIG. 3, in the embodiment, the cover plate 110 is further provided with an outer flange 114 surrounding the inner surface 111 and the heat-dissipating recess 140 for coupling to the bottom plate 120. The caliber size (e.g., opening size) of the heat-dissipating recess 140 is substantially equal to the size of the semiconductor package unit 300, and a depth 143 of the heat-dissipating recess 140 is substantially equal to a thickness 340 of the semiconductor package unit 300. Since the dimension of the semiconductor package unit 300 is substantially the same as the dimension of the heat-dissipating recess 140, the semiconductor package unit 300 can fit completely to be embedded into the heat-dissipating recess 140. In other words, the top surface 310 of the semiconductor package unit 300 exactly overlaps the bottom wall 141 of the heat-dissipating recess 140, and the lateral surfaces 330 of the semiconductor package unit 300 respectively overlap the inner sidewalls 142 of the heat-dissipating recess 140. However, the disclosure is not limited thereto, in another embodiment, only one part of the semiconductor package unit may be located in the heat-dissipating recess, so that the other part of the semiconductor package unit protrudes out of the heat-dissipating recess. In the embodiment, the thickness 340 of the semiconductor package unit 300 is less than a thickness 113 of the cover plate 110, however, the disclosure is not limited thereto.

In addition, when a simulation test is processed, a simulation temperature of the conventional solid-state storage device without the technical features of this embodiment is at 115.2° C., however, a simulation temperature of the solid-state storage device 10 in the embodiment is only at 108.8° C.

It is noted, the semiconductor package unit 300 described in the disclosure includes one or more semiconductor elements, solder balls and an encapsulant (not shown). The semiconductor elements are electrically connected to the solder balls. The encapsulant encapsulates the semiconductor elements and exposes solder balls for protecting the semiconductor elements.

Second Embodiment

Figure 4:
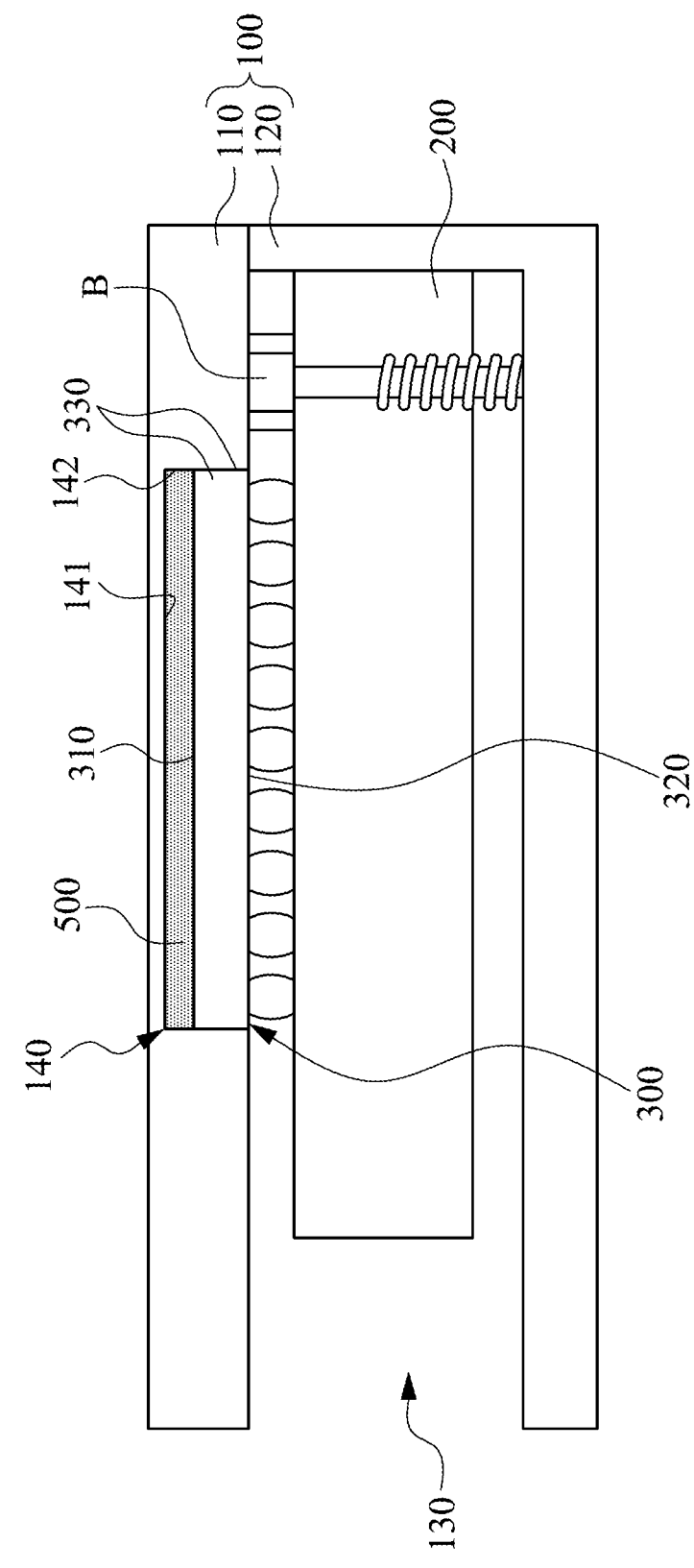
FIG. 4 is a schematic view of a solid-state storage device according to a second embodiment of the disclosure.

FIG. 4 is a schematic view of a solid-state storage device 11 according to a second embodiment of the disclosure. As shown in FIG. 4, the solid-state storage device 11 of FIG. 4 and the solid-state storage device 10 of FIG. 1 are substantially the same, in which the same elements are labeled with the same numerical references in FIG. 4. However, at least one difference of the solid-state storage device 11 of FIG. 5 from the solid-state storage device 10 of FIG. 1 is that, the solid-state storage device 11 includes a first thermal conductivity medium 500. The first thermal conductivity medium 500 is flexible. The first thermal conductivity medium 500 is located in the heat-dissipating recess 140, and the first thermal conductivity medium 500 is directly located between the semiconductor package unit 300 and the cover plate 110. The first thermal conductivity medium 500 is only located between the top surface 310 of the semiconductor package unit 300 and the bottom wall 141 of the heat-dissipating recess 140 in which one surface of the first thermal conductivity medium 500 covers the top surface 310 of the semiconductor package unit 300, and the other surface of the first thermal conductivity medium 500 covers the bottom wall 141 of the heat-dissipating recess 140.

Specifically, the first thermal conductivity medium 500 is in direct contact with the top surface 310 of the semiconductor package unit 300, the bottom wall 141 and the inner sidewalls 142 of the heat-dissipating recess 140, respectively. The lateral surfaces 330 of the semiconductor package unit 300 are still respectively in direct contact with the inner sidewalls 142 of the heat-dissipating recess 140. Preferably, one surface of the first thermal conductivity medium 500 fully fits and is in direct contact with all areas of the top surface 310 of the semiconductor package unit 300, and the other surface of the first thermal conductivity medium 500 fully fits and is in direct contact with all areas of the bottom wall 141 of the heat-dissipating recess 140. The first thermal conductivity medium 500, for example, is a heat-conducting rubber sheet or a heat-conducting grease.

In addition, when a simulation test is processed, a simulation temperature of the conventional solid-state storage device without the technical features of this embodiment is at 115.2° C., however, a simulation temperature of the solid-state storage device 11 in the embodiment is only at 110° C.

Therefore, no matter whether the top surface 310 of the semiconductor package unit 300 and the bottom wall 141 of the heat-dissipating recess 140 are fit to each other, because the first thermal conductivity medium 500 is flexible, the first thermal conductivity medium 500 can be deformed to be attached to the top surface 310 of the semiconductor package unit 300 and the bottom wall 141 of the heat-dissipating recess 140. Thus, heat energy of the semiconductor package unit 300 still can be transmitted to the housing 100 from the top surface 310 of the semiconductor package unit 300 through the first thermal conductivity medium 500 for increasing heat transfer efficiency.

Third Embodiment

Figure 5:
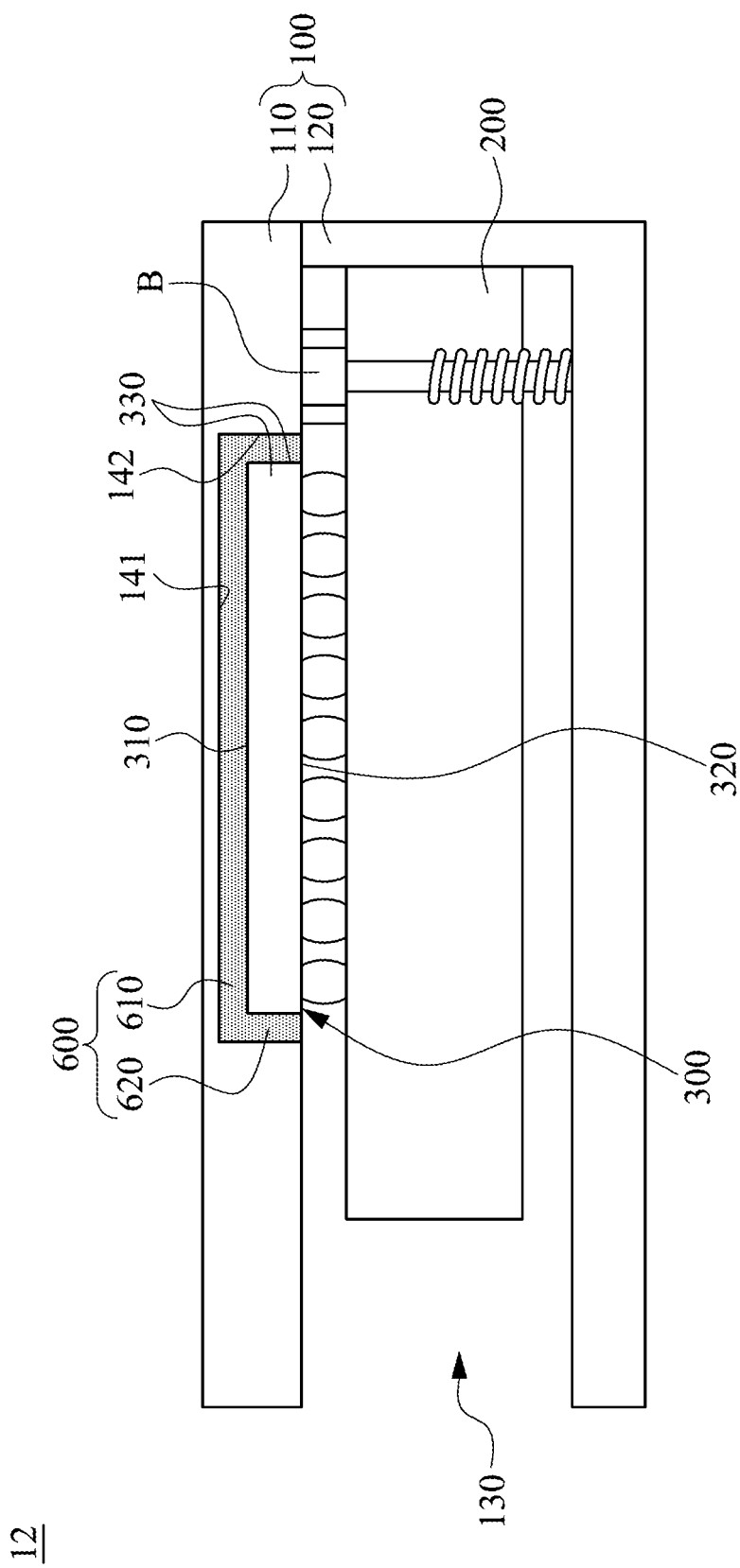
FIG. 5 is a schematic view of a solid-state storage device according to a third embodiment of the disclosure.

FIG. 5 is a schematic view of a solid-state storage device 12 according to a third embodiment of the disclosure. As shown in FIG. 5, the solid-state storage device 12 of FIG. 5 and the solid-state storage device 10 of FIG. 1 are substantially the same, in which the same elements are labeled with the same numerical references in FIG. 5. However, at least one difference of the solid-state storage device 12 of FIG. 5 from the solid-state storage device 10 of FIG. 1 is that, the solid-state storage device 12 includes a second thermal conductivity medium 600. The second thermal conductivity medium 600 is flexible. The second thermal conductivity medium 600 is located in the heat-dissipating recess 140, and the second thermal conductivity medium 600 wraps the top surface 310 and the lateral surfaces 330 of the semiconductor package unit 300. The second thermal conductivity medium 600 is located between the top surface 310 of the semiconductor package unit 300 and the bottom wall 141 of the heat-dissipating recess 140, and is located between the lateral surfaces 330 of the semiconductor package unit 300 and the inner sidewalls 142 of the heat-dissipating recess 140.

Specifically, one part 610 of the second thermal conductivity medium 600 is in direct contact with the top surface 310 of the semiconductor package unit 300 and the bottom wall 141 of the heat-dissipating recess 140, and another part 620 of the second thermal conductivity medium 600 is in direct contact with the lateral surfaces 330 of the semiconductor package unit 300 and the inner sidewalls 142 of the heat-dissipating recess 140, respectively.

Preferably, the part 610 of the second thermal conductivity medium 600 fits and is in direct contact with all areas of the top surface 310 of the semiconductor package unit 300 and all areas of the bottom wall 141 of the heat-dissipating recess 140. The other part 620 of the second thermal conductivity medium 600 fits and is in direct contact with all areas of each of the lateral surfaces 330 of the semiconductor package unit 300 and all areas of each of the inner sidewalls 142 of the heat-dissipating recess 140. The second thermal conductivity medium 600, for example, is a heat-conducting rubber sheet or a heat-conducting grease.

In addition, when a simulation test is processed, a simulation temperature of the conventional solid-state storage device without the technical features of this embodiment is at 115.2° C., however, a simulation temperature of the solid-state storage device 12 in the embodiment is only at 105.1° C.

Therefore, no matter whether the top surface 310 of the semiconductor package unit 300 and the bottom wall 141 of the heat-dissipating recess 140 are fit to each other, and whether each of the lateral surfaces 330 of the semiconductor package unit 300 and one of the inner sidewalls 142 of the heat-dissipating recess 140 are fit to each other, because the second thermal conductivity medium 600 is flexible, the second thermal conductivity medium 600 can be deformed to be attached to the top surface 310 of the semiconductor package unit 300 and the bottom wall 141 of the heat-dissipating recess 140, and attached to the lateral surfaces 330 of the semiconductor package unit 300 and the inner sidewalls 142 of the heat-dissipating recess 140.

Thus, heat energy of the semiconductor package unit 300 still can be transmitted to the housing 100 from the top surface 310 and the lateral surfaces 330 of the semiconductor package unit 300 through the second thermal conductivity medium 600 for increasing heat transfer efficiency.

Fourth Embodiment

Figure 6:
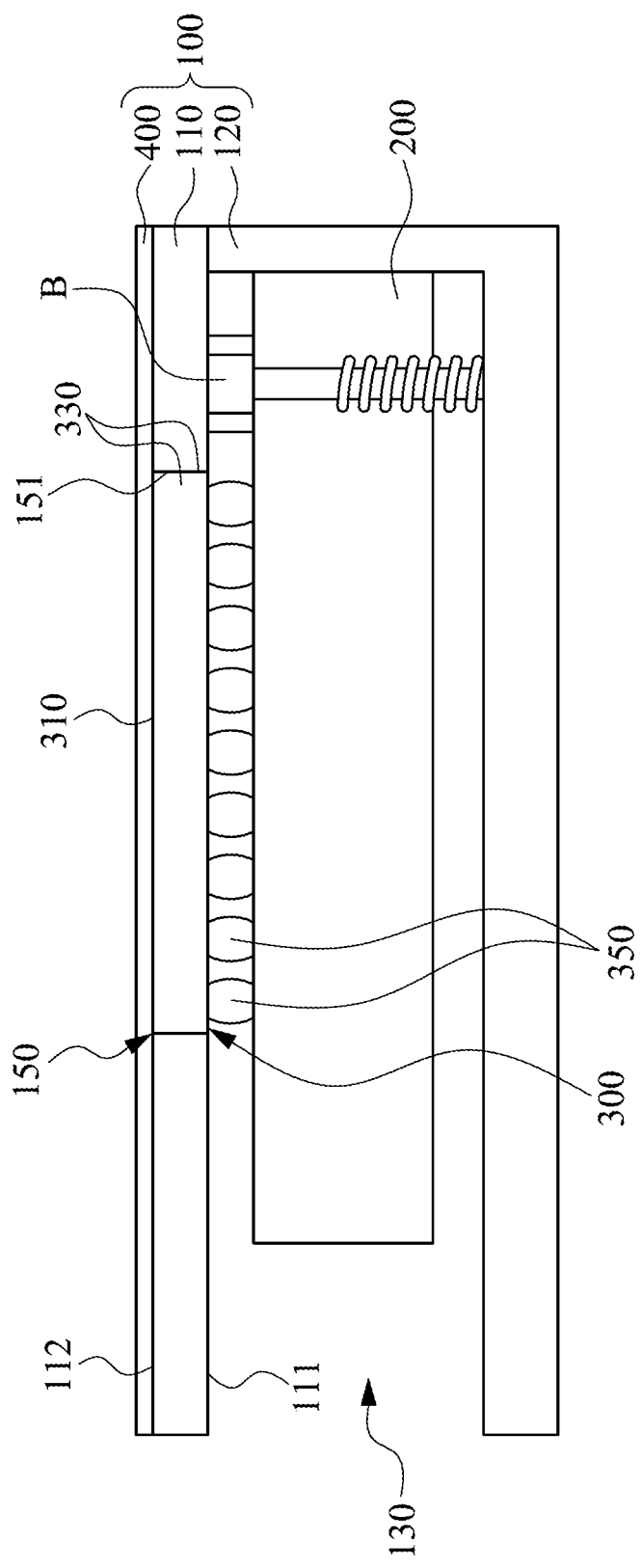
FIG. 6 is a schematic view of a solid-state storage device according to a fourth embodiment of the disclosure.
Figure 7:
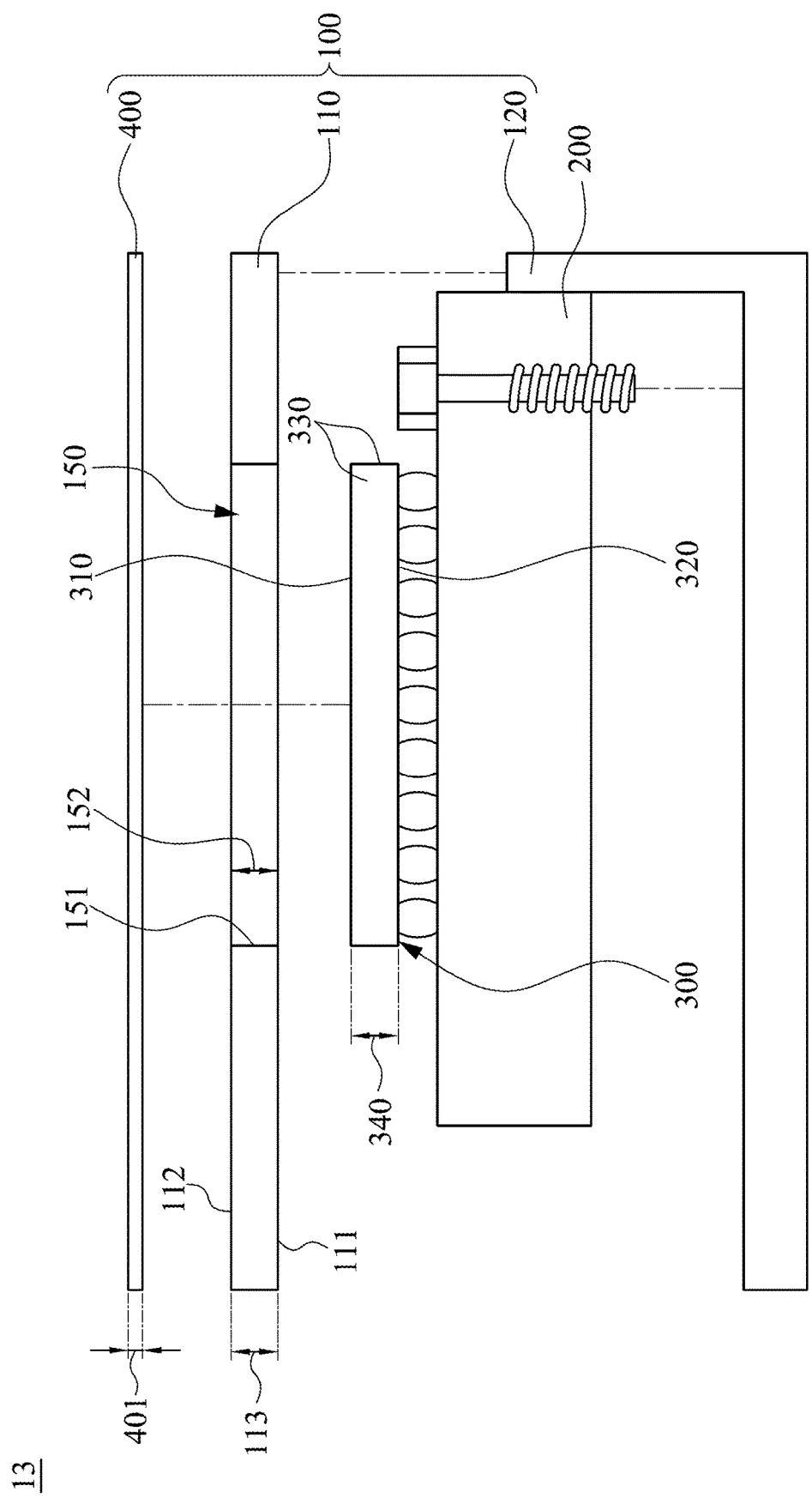
FIG. 7 is an exploded view of the solid-state storage device of FIG. 6.

FIG. 6 is a schematic view of a solid-state storage device 13 according to a fourth embodiment of the disclosure, and FIG. 7 is an exploded view of the solid-state storage device of FIG. 6. As shown in FIG. 6-FIG. 7, the solid-state storage device 13 of FIG. 6 and the solid-state storage device 10 of FIG. 1 are substantially the same, in which the same elements are labeled with the same numerical references in FIG. 6. However, at least one difference of the solid-state storage device 13 of FIG. 6 from the solid-state storage device 10 of FIG. 1 is that, the heat-dissipating recess 150 is a through hole rather than a blind hole. The housing 100 further includes a heat conduction film 400. The heat conduction film 400 covers both of the cover plate 110 and the heat-dissipating recess 150. The semiconductor package unit 300 is thermally connected to the heat conduction film 400 and the housing 100 with the top surface 310 and the lateral surfaces 330 of the semiconductor package unit 300, respectively.

Specifically, in the embodiment, the cover plate 110 is formed in a plate shape, and the cover plate 110 is provided with an inner surface 111 and an outer surface 112 which is opposite to the inner surface 111. The heat-dissipating recess 150 penetrates through the cover plate 110 to be respectively connected to the inner surface 111 and the outer surface 112. Specifically, the heat-dissipating recess 150 is formed with a plurality of inner lateral walls 151 which mutually surround and define a space capable of receiving the semiconductor package unit 300. The heat conduction film 400 is formed in a film shape, and the heat conduction film 400 covers the outer surface 112 of the cover plate 110. Thus, when the wiring board 200 covers the inner surface 111 of the cover plate 110, the semiconductor package unit 300 extends into the heat-dissipating recess 150 so that the top surface 310 of the semiconductor package unit 300 is in direct contact with the heat conduction film 400, and the lateral surfaces 330 of the semiconductor package unit 300 are respectively in direct contact with the inner lateral walls 151 of the heat-dissipating recess 150. Preferably, the all areas of the top surface 310 of the semiconductor package unit 300 fully fit and are in direct contact with the heat conduction film 400, and all areas of each of the lateral surfaces 330 of the semiconductor package unit 300 fully fit and are in direct contact with one of the inner lateral walls 151 of the heat-dissipating recess 150.

In the embodiment, the caliber size of the heat-dissipating recess 150 is substantially equal to the size of the semiconductor package unit 300, and a depth 152 of the heat-dissipating recess 150 is substantially equal to a thickness 340 of the semiconductor package unit 300. Since the volume of the semiconductor package unit 300 is substantially the same as the volume of the heat-dissipating recess 150, the semiconductor package unit 300 can fit completely to be embedded into the heat-dissipating recess 150. In other words, the top surface 310 of the semiconductor package unit 300 is exactly in direct contact the heat conduction film 400, and the lateral surfaces 330 of the semiconductor package unit 300 exactly overlap the inner lateral walls 151 of the heat-dissipating recess 150, respectively. However, the disclosure is not limited thereto, in another embodiment, only one part of the semiconductor package unit may be located in the heat-dissipating recess, so that another part of the semiconductor package unit protrudes out of the heat-dissipating recess.

In the embodiment, an area size of one surface of the heat conduction film 400 is substantially the same as an area size of the outer surface 112 of the cover plate 110. For example, the thickness 401 of the heat conduction film 400 substantially is 1 mm, however, the disclosure is not limited thereto. Furthermore, the material of the cover plate 110 is metal or other highly thermally conductive material, and the material of the heat conduction film 400 is metal or other highly thermally conductive material, preferably, the thermal conductivity of the heat conduction film 400 is greater than the thermal conductivity of the cover plate 110, however, the disclosure is not limited thereto.

When a simulation test is processed, a simulation temperature of the conventional solid-state storage device without the technical features of this embodiment is at 115.2° C., however, a simulation temperature of the solid-state storage device 13 in the embodiment is only at 108.8° C.

Fifth Embodiment

Figure 8:
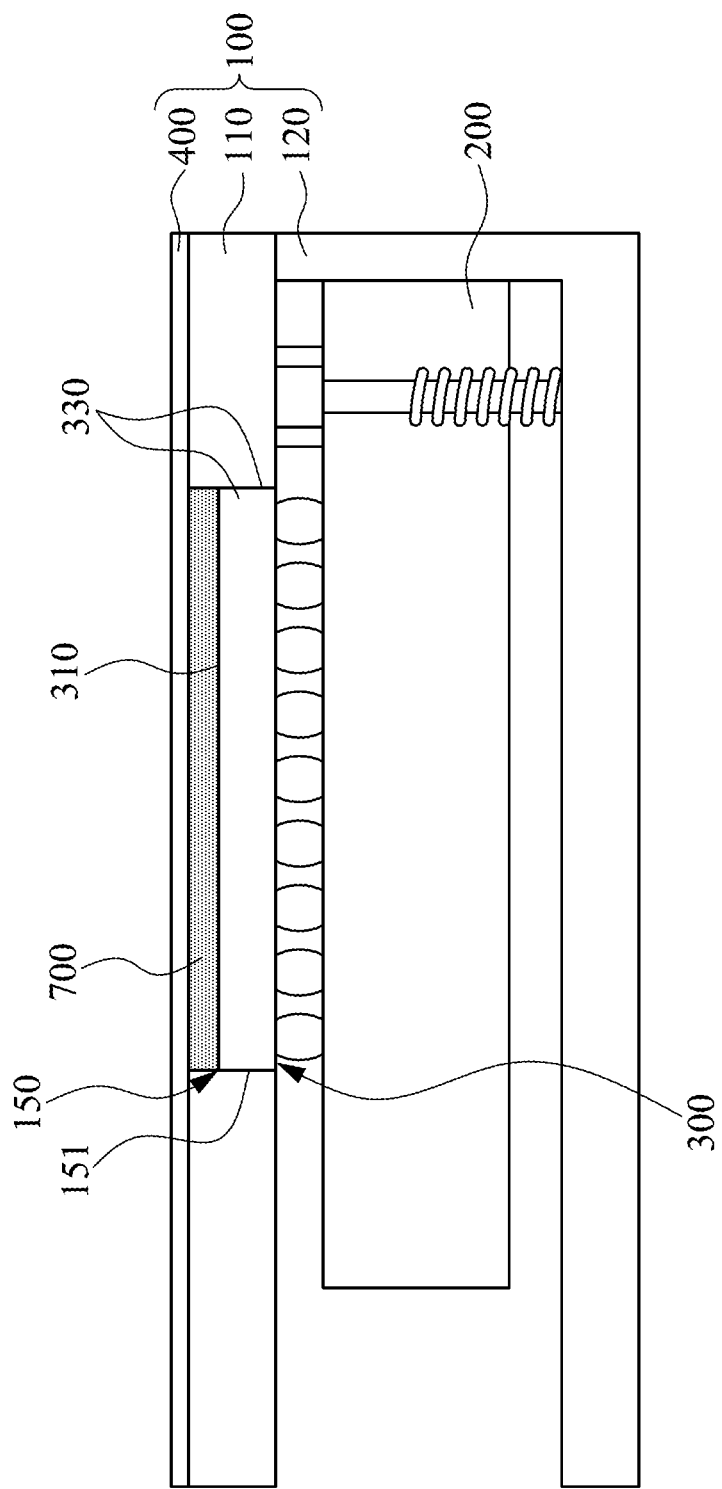
FIG. 8 is a schematic view of a solid-state storage device according to a fifth embodiment of the disclosure.

FIG. 8 is a schematic view of a solid-state storage device 14 according to a fifth embodiment of the disclosure. As shown in FIG. 8, the solid-state storage device 14 of FIG. 8 and the solid-state storage device 13 of FIG. 6 are substantially the same, in which the same elements are labeled with the same numerical references in FIG. 8. However, at least one difference of the solid-state storage device 14 of FIG. 8 from the solid-state storage device 13 of FIG. 6 is that, the solid-state storage device 14 includes a third thermal conductivity medium 700. The third thermal conductivity medium 700 is flexible. The third thermal conductivity medium 700 is located in the heat-dissipating recess 150, and the third thermal conductivity medium 700 is directly located between the semiconductor package unit 300 and the heat conduction film 400. The third thermal conductivity medium 700 is only located between the top surface 310 of the semiconductor package unit 300 and the heat conduction film 400 in which one surface of the third thermal conductivity medium 700 covers the top surface 310 of the semiconductor package unit 300, and the other surface of the third thermal conductivity medium 700 covers the heat conduction film 400.

Specifically, the third thermal conductivity medium 700 is in direct contact with the top surface 310 of the semiconductor package unit 300, the heat conduction film 400 and the inner lateral walls 151 of the heat-dissipating recess 150, respectively. The lateral surfaces 330 of the semiconductor package unit 300 are still respectively in direct contact with the inner lateral walls 151 of the heat-dissipating recess 150. Preferably, one surface of the third thermal conductivity medium 700 fully fits and is in direct contact with all areas of the top surface 310 of the semiconductor package unit 300, and the other surface of the third thermal conductivity medium 700 fully fits and is in direct contact with the heat conduction film 400. The third thermal conductivity medium 700, for example, is a heat-conducting rubber sheet or a heat-conducting grease.

Furthermore, when a simulation test is processed, a simulation temperature of the conventional solid-state storage device without the technical features of this embodiment is at 115.2° C., however, a simulation temperature of the solid-state storage device 14 in the embodiment is only at 101.2° C.

Therefore, no matter whether the top surface 310 of the semiconductor package unit 300 and the heat conduction film 400 are fit to each other, because the third thermal conductivity medium 700 is flexible, the third thermal conductivity medium 700 can be deformed to be attached to the top surface 310 of the semiconductor package unit 300 and the surface of the heat conduction film 400. Thus, heat energy of the semiconductor package unit 300 still can be transmitted to the heat conduction film 400 and the housing 100 from the top surface 310 of the semiconductor package unit 300 through the third thermal conductivity medium 700 for increasing heat transfer efficiency.

Sixth Embodiment

Figure 9:
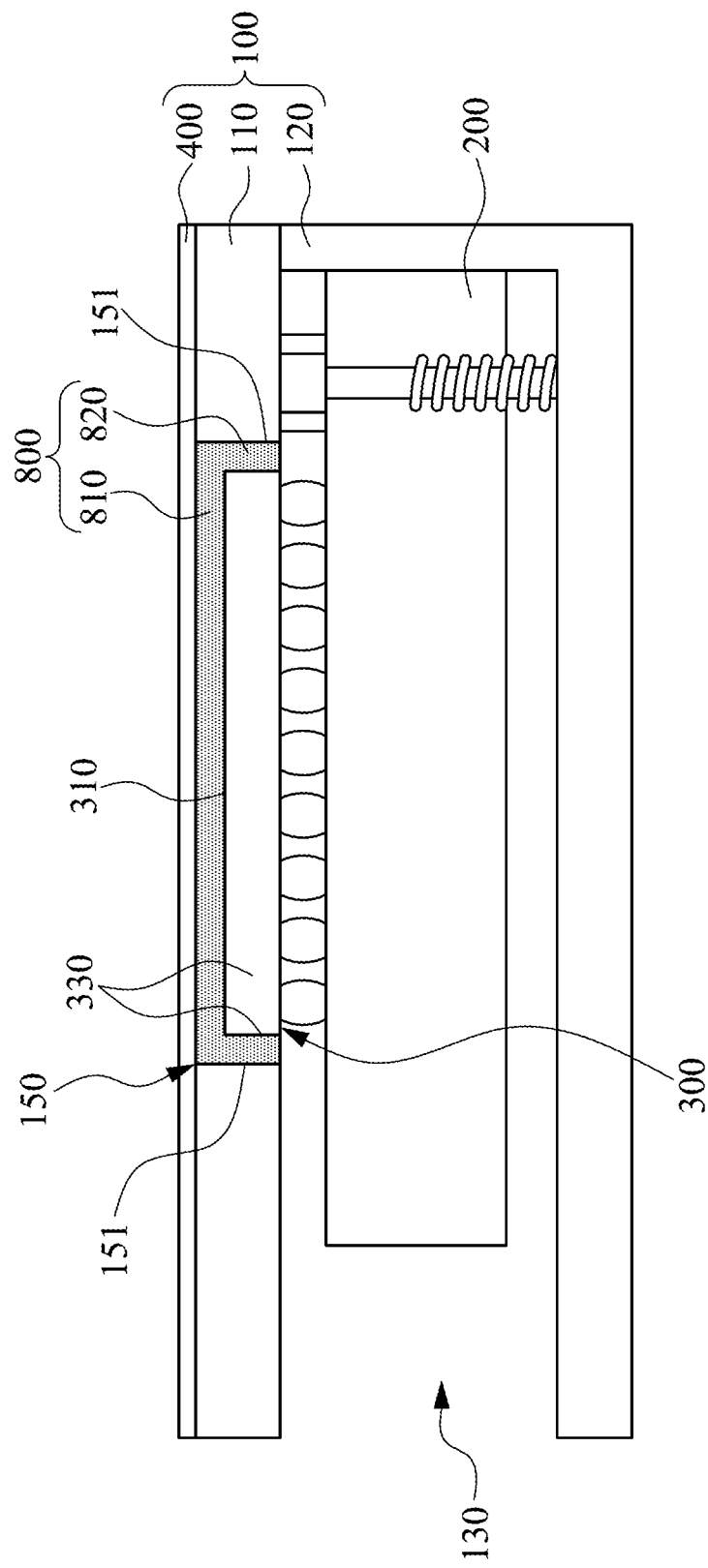
FIG. 9 is a schematic view of a solid-state storage device according to a sixth embodiment of the disclosure.

FIG. 9 is a schematic view of a solid-state storage device 15 according to a sixth embodiment of the disclosure. As shown in FIG. 9, the solid-state storage device 15 of FIG. 9 and the solid-state storage device 13 of FIG. 6 are substantially the same, in which the same elements are labeled with the same numerical references in FIG. 9. However, at least one difference of the solid-state storage device 15 of FIG. 9 from the solid-state storage device 13 of FIG. 6 is that, the solid-state storage device 15 includes a fourth thermal conductivity medium 800. The fourth thermal conductivity medium 800 is flexible. The fourth thermal conductivity medium 800 is located in the heat-dissipating recess 150, and the fourth thermal conductivity medium 800 wraps the top surface 310 and the lateral surfaces 330 of the semiconductor package unit 300. The fourth thermal conductivity medium 800 is located between the top surface 310 of the semiconductor package unit 300 and the heat conduction film 400, and is located between the lateral surfaces 330 of the semiconductor package unit 300 and the inner lateral walls 151 of the heat-dissipating recess 150.

Specifically, one part 810 of the fourth thermal conductivity medium 800 is in direct contact with the top surface 310 of the semiconductor package unit 300 and the heat conduction film 400, and another part 820 of the fourth thermal conductivity medium 800 is in direct contact with the lateral surfaces 330 of the semiconductor package unit 300 and the inner lateral walls 151 of the heat-dissipating recess 150, respectively.

Preferably, the part 810 of the fourth thermal conductivity medium 800 fits and is in direct contact with all areas of the top surface 310 of the semiconductor package unit 300 and the heat conduction film 400. The other part 820 of the fourth thermal conductivity medium 800 fits and is in direct contact with all areas of each of the lateral surfaces 330 of the semiconductor package unit 300 and all areas of each of the inner lateral walls 151 of the heat-dissipating recess 150, respectively. The fourth thermal conductivity medium 800, for example, is a heat-conducting rubber sheet or a heat-conducting grease.

Furthermore, when a simulation test is processed, a simulation temperature of the conventional solid-state storage device without the technical features of this embodiment is at 115.2° C., however, a simulation temperature of the solid-state storage device 15 in the embodiment is only at 101.3° C.

Therefore, no matter whether the top surface 310 of the semiconductor package unit 300 and the heat conduction film 400 are fit to each other, and whether each of the lateral surfaces 330 of the semiconductor package unit 300 and one of the inner lateral walls 151 of the heat-dissipating recess 150 are fit to each other, because the fourth thermal conductivity medium 800 is flexible, the fourth thermal conductivity medium 800 can be deformed to be attached to the top surface 310 of the semiconductor package unit 300 and the heat conduction film 400, and attached to the lateral surfaces 330 of the semiconductor package unit 300 and the inner lateral walls 151 of the heat-dissipating recess 150. Thus, heat energy of the semiconductor package unit 300 still can be transmitted to the heat conduction film 400 and the housing 100 from the top surface 310 and the lateral surfaces 330 of the semiconductor package unit 300 through the fourth thermal conductivity medium 800 for increasing heat transfer efficiency.

Seventh Embodiment

Figure 10:
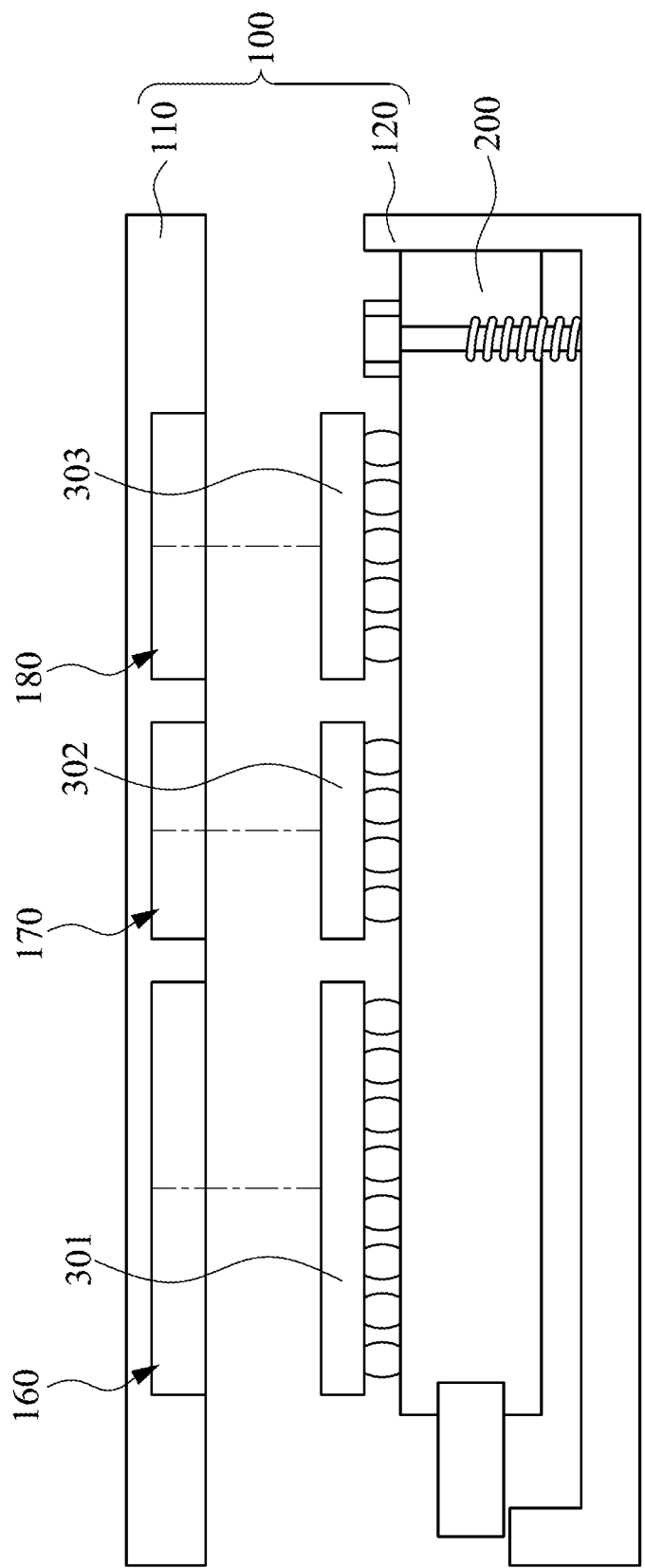
FIG. 10 is an exploded view of a solid-state storage device according to a seventh embodiment of the disclosure.

FIG. 10 is an exploded view of a solid-state storage device 16 according to a seventh embodiment of the disclosure. As shown in FIG. 10, the solid-state storage device 16 of FIG. 10 can be implemented to any solid-state storage device 10-15 above, in which the same elements are labeled with the same numerical references in FIG. 10. However, at least one difference of the solid-state storage device 16 of FIG. 10 from any solid-state storage device 10-15 is that, in seventh embodiment, the semiconductor package unit and the corresponding heat-dissipating recess are not limited to single one in number, respectively, and the semiconductor package unit is not limited to a master controller chip or a memory unit.

For example, the solid-state storage device 16 includes a master controller chip 301, a random-access memory unit 302 (e.g., double data rate synchronous dynamic random-access memory, DDR SDRAM) and a flash memory unit 303 (e.g., NAND FLASH). The master controller chip 301, the random-access memory unit 302, and the flash memory unit 303 are respectively soldered to the wiring board 200, and the inner surface 111 of the cover plate 110 is concavely formed with a first heat-dissipating recess 160, a second heat-dissipating recess 170 and a third heat-dissipating recess 180. Thus, when the cover plate 110 covers the wiring board 200, the master controller chip 301, the random-access memory unit 302, and the flash memory unit 303 are respectively embedded in the first heat-dissipating recess 160, the second heat-dissipating recess 170 and the third heat-dissipating recess 180 to thermally contact with the cover plate 110 of the housing 100.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A solid-state storage device, comprising:
a housing comprising a cover plate, a bottom plate and a heat-dissipating recess formed on the cover plate, and the cover plate directly covering the bottom plate to define a receiving space between the cover plate and the bottom plate, wherein the material of the cover plate is metal, and the cover plate comprises an inner surface and an outer surface, the cover plate is further provided with an outer flange surrounding the inner surface and the heat-dissipating recess of the cover plate for directly coupling to the bottom plate, and the heat-dissipating recess is formed on the inner surface of the cover plate, and the heat-dissipating recess comprises a bottom wall and a plurality of inner sidewalls, the bottom wall is adjacent to the inner sidewalls, and is surrounded by the inner sidewalls;
a wiring board that is smaller than both of the bottom plate and the cover plate, and totally received in the receiving space;
a bolt totally received in the receiving space of the housing, and fixing the wiring board on the bottom plate; and
a semiconductor package unit embedded in the heat-dissipating recess, and provided with a top surface, a bottom surface and a plurality of lateral surfaces, the bottom surface which is opposite to the top surface and is adjacent to the lateral surfaces, a caliber size of the heat-dissipating recess is substantially equal to a size of the semiconductor package unit, and a depth of the heat-dissipating recess is substantially equal to a thickness of the semiconductor package unit,
wherein the bottom surface of the semiconductor package unit is fixed to the wiring board, and the top surface and the lateral surfaces of the semiconductor package unit are thermally connected to the housing in the heat-dissipating recess, and an area of the top surface of the semiconductor package unit in the heat-dissipating recess is in direct contact with the housing, and the lateral surfaces of the semiconductor package unit in the heat-dissipating recess are respectively in direct contact with the inner sidewalls of the heat-dissipating recess,
wherein the semiconductor package unit comprises at least one semiconductor element, solder balls and an encapsulant, the at least one semiconductor element is electrically connected to the solder balls, and the encapsulant encapsulates the at least one semiconductor element, and exposes the solder balls for protecting the at least one semiconductor element, and the solder balls are soldered on the wiring board.

2. The solid-state storage device of claim 1, wherein the top surface of the semiconductor package unit is in direct contact with the bottom wall of the heat-dissipating recess.

3. The solid-state storage device of claim 1, wherein the cover plate comprises an inner surface and an outer surface which are opposite to each other, and the heat-dissipating recess penetrates through the cover plate to be respectively connected to the inner surface and the outer surface, and the heat-dissipating recess is formed with a plurality of inner lateral walls; and
the housing further comprises a heat conduction film covering the outer surface of the cover plate.

4. The solid-state storage device of claim 3, wherein the lateral surfaces of the semiconductor package unit are in direct contact with the inner lateral walls of the heat-dissipating recess, and the heat conduction film is in direct contact with the top surface of the semiconductor package unit.

5. The solid-state storage device of claim 1, wherein the semiconductor package unit is at least partially received in the heat-dissipating recess.

* * * * *